(12) United States Patent
Wang et al.

(10) Patent No.: US 11,309,335 B2
(45) Date of Patent: Apr. 19, 2022

(54) ARRAY SUBSTRATE, MANUFACTURING METHOD THEREOF, AND DISPLAY MODULE

(71) Applicant: WUHAN CHINA STAR OPTOELECTRONICS SEMICONDUCTOR DISPLAY TECHNOLOGY CO., LTD., Hubei (CN)

(72) Inventors: Wei Wang, Hubei (CN); Qing Huang, Hubei (CN)

(73) Assignee: WUHAN CHINA STAR OPTOELECTRONICS SEMICONDUCTOR DISPLAY TECHNOLOGY CO., LTD., Hubei (CN)

(*) Notice: Subject to any disclaimer, the term of this patent is extended or adjusted under 35 U.S.C. 154(b) by 48 days.

(21) Appl. No.: 16/619,458

(22) PCT Filed: Nov. 15, 2018

(86) PCT No.: PCT/CN2018/115617
§ 371 (c)(1),
(2) Date: Dec. 5, 2019

(87) PCT Pub. No.: WO2020/077718
PCT Pub. Date: Apr. 23, 2020

(65) Prior Publication Data
US 2020/0335527 A1    Oct. 22, 2020

(51) Int. Cl.
*H01L 27/12* (2006.01)
*H01L 21/265* (2006.01)
*H01L 29/786* (2006.01)

(52) U.S. Cl.
CPC .... *H01L 27/1222* (2013.01); *H01L 21/26513* (2013.01); *H01L 27/127* (2013.01); *H01L 29/78696* (2013.01)

(58) Field of Classification Search
CPC ............... H01L 27/1222; H01L 27/127; H01L 29/78696; H01L 21/26513
See application file for complete search history.

(56) References Cited

U.S. PATENT DOCUMENTS

| | | | | |
|---|---|---|---|---|
| 4,015,279 A | * | 3/1977 | Ham | H01L 23/3171 257/354 |
| 4,918,498 A | * | 4/1990 | Plus | H01L 27/12 257/354 |
| 6,184,556 B1 | * | 2/2001 | Yamazaki | H01L 27/1203 257/219 |
| 2007/0159565 A1 | * | 7/2007 | Segawa | G02F 1/136209 349/38 |
| 2010/0099227 A1 | * | 4/2010 | Yamazaki | H01L 27/127 438/164 |

* cited by examiner

*Primary Examiner* — Aaron J Gray
(74) *Attorney, Agent, or Firm* — Mark M. Friedman

(57) ABSTRACT

The present invention provides an array substrate, a method of fabricating the same, and a display module. The array substrate includes a substrate and a thin film transistor. An active layer of the thin film transistor includes: a first region including source and drain doped regions and a channel region; a second region surrounding at least a side of the channel region not in contact with the source and drain doped regions, and the first region forming a PN junction with the second region.

14 Claims, 4 Drawing Sheets

ARRAY SUBSTRATE, MANUFACTURING METHOD THEREOF, AND DISPLAY MODULE

FIELD OF INVENTION

The present invention relates to the field of display, and in particular, to an array substrate, a manufacturing method thereof, and a display module.

DESCRIPTION OF PRIOR ART

Array substrates fabricated using low temperature polysilicon (LTPS) have high carrier mobility and are therefore the first choice for driving back-plates of flexible display panels. However, in a thin film transistor device structure of the array substrate, a patterned active layer is used as an active layer, and such a structure has its shortcomings that stress concentration occurs at edges of a channel of the active layer under the action of bending stress. This has a negative influence on electrical properties of the thin film transistor device, which in turn affects the normal display of the display panel.

Therefore, there is an urgent need for an array substrate, a method of fabricating the same, and a display module to solve the above problems.

SUMMARY OF INVENTION

The present invention provides an array substrate, a manufacturing method thereof, and a display module, so as to solve the negative influences of stress concentration at edges of the channel of an active layer when the existing array substrate is subjected to the bending stress, causing poor electrical conductivity of a thin film transistor device.

To solve the above problems, the technical solution provided by the present invention is as follows:

The present invention provides an array substrate including a substrate and a thin film transistor disposed on the substrate, wherein an active layer of the thin film transistor includes: a first region including source and drain doped regions doped with a first ion and a channel region which is not ion-doped, disposed between the source and drain doped regions; and a second region at least surrounding a side of the channel region not in contact with the source and drain doped regions, the second region being doped with a second ion, and the first region and the second region forming a PN junction.

According to an embodiment of the present invention, the first region and the second region have different conductivities.

According to an embodiment of the present invention, the first ion and the second ion are derived from different elements.

According to an embodiment of the present invention, the first region and the second region have a same thickness.

According to an embodiment of the present invention, the thin film transistor further includes a gate insulating layer disposed on the active layer and a gate layer disposed on the gate insulating layer, and wherein a pattern of the gate layer covers a pattern of the channel region from a top view.

According to an embodiment of the present invention, the second region is connected to a metal line having a constant voltage.

According to an embodiment of the present invention, the second region surrounds the first region.

According to another embodiment of the present invention, a method of fabricating an array substrate is provided, including:

Step S10, providing a substrate, and forming a polysilicon layer on the substrate, the polysilicon layer including a first region and a second region;

Step S20, performing implantation of a second ion on the second region;

Step S30, sequentially forming a gate insulating layer and a gate layer on the polysilicon layer which has been subjected to ion-implantation once, the gate layer covering the channel region;

Step S40, performing implantation of a first ion on the second region and the channel region of the first region, wherein areas in the first region which have been subjected to ion-implantation twice are formed into source and drain doped regions; and Step S50, electrically connecting a metal wire having a constant voltage to the second region to form an active layer, wherein the first region includes the source and drain doped regions and the channel region between the source and drain doped regions, the second region at least surrounds a side of the channel region not in contact with the source and drain doped regions, and the first region and the second region form a PN junction.

According to an embodiment of the present invention, the first ions and the second ions are derived from different elements.

According to an embodiment of the present invention, a concentration of the second ion during the implantation of the second ion is greater than a concentration of the first ion during the implantation of the first ion.

According to an embodiment of the present invention, the step S20 includes: forming a photoresist layer on the polysilicon layer, exposing and developing the photoresist layer to obtain a pattern of the second region, performing the implantation of the second ion on the second region, and stripping the patterned photoresist.

According to an embodiment of the present invention, the method of fabricating an array substrate further includes forming an insulating layer and a gate layer on the active layer, wherein a pattern of the gate layer covers a pattern of the channel region from a top view.

According to an embodiment of the present invention, the second region surrounds the first region.

According to another embodiment of the present invention, a display module is provided, including an array substrate and a polarizer and a cover plate disposed over the array substrate, the array substrate including a substrate and a thin film transistor disposed on the substrate, wherein an active layer of the thin film transistor includes: a first region including source and drain doped regions doped with a first ion and a channel region which is not ion-doped, disposed between the source and drain doped regions; and a second region at least surrounding a side of the channel region not in contact with the source and drain doped regions, the second region being doped with a second ion, and the first region and the second region forming into a PN junction.

According to an embodiment of the present invention, the first region and the second region have different conductivities.

According to an embodiment of the present invention, the first ion and the second ion are derived from different elements.

According to an embodiment of the present invention, the first region and the second region have a same thickness.

According to an embodiment of the present invention, the thin film transistor further includes a gate insulating layer disposed on the active layer and a gate layer disposed on the gate insulating layer, and wherein a pattern of the gate covers a pattern of the channel region from a top view.

According to an embodiment of the present invention, the second region surrounds the first region.

According to an embodiment of the present invention, the second region is connected to a metal line having a constant voltage.

The present invention improves the bending resistance of a thin film transistor by providing a second region surrounding at least a side of a channel region not in contact with source and drain doped regions to reduce bending stress received by the channel region.

BRIEF DESCRIPTION OF DRAWINGS

In order to more clearly illustrate the embodiments or the technical solutions of the existing art, the drawings illustrating the embodiments or the existing art will be briefly described below. Obviously, the drawings in the following description merely illustrate some embodiments of the present invention. Other drawings may also be obtained by those skilled in the art according to these figures without paying creative work.

DETAILED DESCRIPTION OF PREFERRED EMBODIMENTS

The following description of the various embodiments is provided to illustrate the specific embodiments of the invention. The spatially relative directional terms mentioned in the present invention, such as "upper", "lower", "before", "after", "left", "right", "inside", "outside", "side", etc. and the like, may be used herein for ease of description to describe one element or feature's relationship to another element(s) or feature(s) as illustrated in the figures which are merely references. The spatially relative terms are intended to encompass different orientations in addition to the orientation as depicted in the figures.

Referring to FIGS. 1-4, the present invention provides an array substrate including a substrate 11 and a thin film transistor 12 disposed on the substrate 11.

The substrate 11 is a flexible substrate, and a material for preparing the flexible substrate includes polyimide.

In an embodiment, a barrier layer and a buffer layer may be further disposed between the substrate 11 and the thin film transistor 12, and may be specifically designed according to actual needs.

Figure 1:
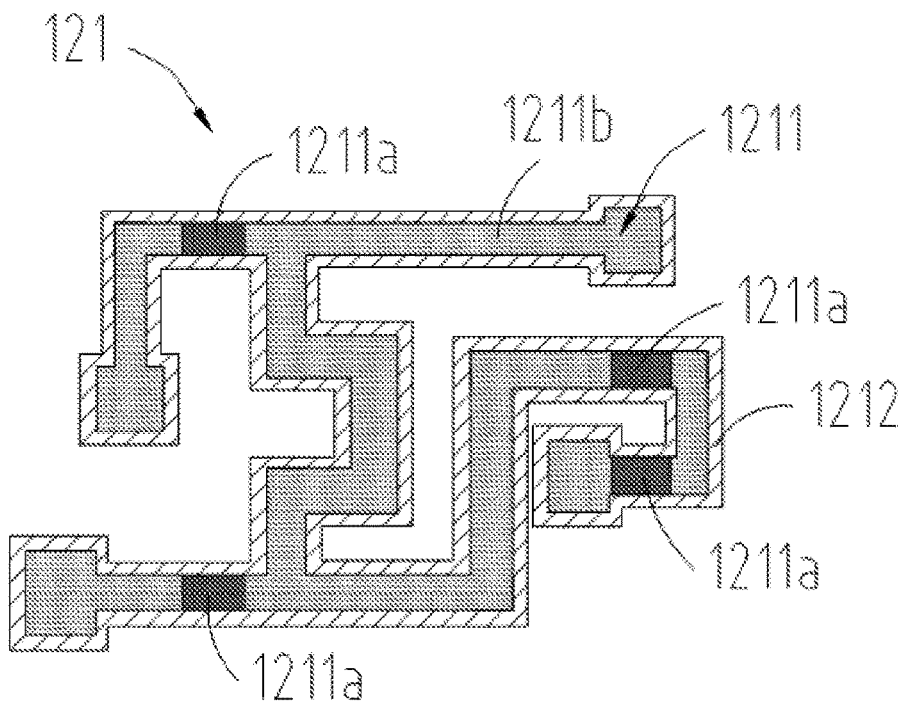
FIG. 1 is a schematic structural diagram of an active layer in an array substrate according to an embodiment of the present invention.
Figure 2:
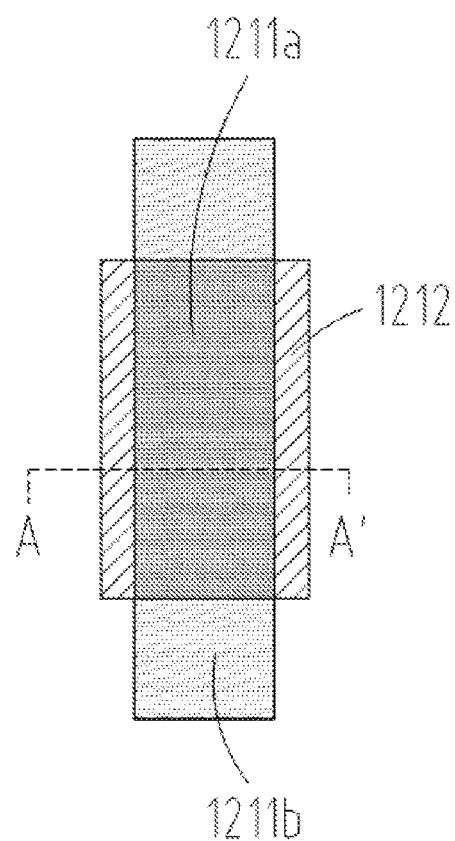
FIG. 2 is a partial structural diagram of an active layer according to an embodiment of the present invention.

The structure of the active layer 121 is shown in FIG. 1, which is a schematic structural diagram of an active layer in an array substrate according to an embodiment of the present invention.

The active layer 121 of the thin film transistor 12 includes a first region 1211 and a second region 1212.

The first region 1211 includes source and drain doped regions 1211b doped with a first ion and a channel region 1211a which is not ion-doped disposed between the source and drain doped regions 1211b; and the second region 1212 at least surrounding a side of the channel region 1211a not in contact with the source and drain doped regions 1211b, the second region 1212 being doped with a second ion, and the first region 1211 and the second region 1212 forming a PN junction.

In an embodiment, when an array substrate is subjected to bending stress, the channel region 1211a is easily broken down due to stress concentration at edge of the channel region 1211a. Therefore, the present invention achieves the purpose of protecting the channel region 1211a by providing the second region 1212 surrounding the side of the channel region 1211a, thereby alleviating the bending stress at the channel region 1211a. However, because the thin film transistor 12 is an energized device, it is necessary to avoid electrical interference of the electrical properties of the second region 1212 on the first region 1211, thus defining the second region 1212 and the first region 1211 to form a PN junction.

In an embodiment, the first ion and the second ion are derived from different elements, and by using different ion elements to form the source and drain doped regions 1211b and the second region 1212, the PN junction is formed between the source and drain doped regions 1211b, the second region 1212, and becomes a barrier for blocking carrier diffusion, to realize electrical blocking between the source and drain doping regions 1211b, the second region 1212, and the channel region 1211a.

In an embodiment, the first region 1211 and the second region 1212 have different conductivities.

In an embodiment, the first ion and the second ion are respectively a P-type ion and an N-type ion, and the first ion and the second ion are derived from different elements.

In an embodiment, in order to prevent negative influence on the electrical conduction within the active layer due to the PN junction formed by the first region 1211 and the second region 1212, the second region 1212 is connected to a metal line having a constant voltage to apply a constant bias to the second region 1212 to enhance electrical blocking between the source and drain doped regions 1211b, the second region 1212, and the channel region 1211a.

In an embodiment, the first region 1211 and the second region 1212 are equal in thickness, thereby preventing the first region 1211 and the second region 1212 from being separated by a thickness difference, which may impact the electrical properties of thin film transistors. It can also be understood that the first region 1211 is disposed in the same layer as the second region 1212.

Figure 3:
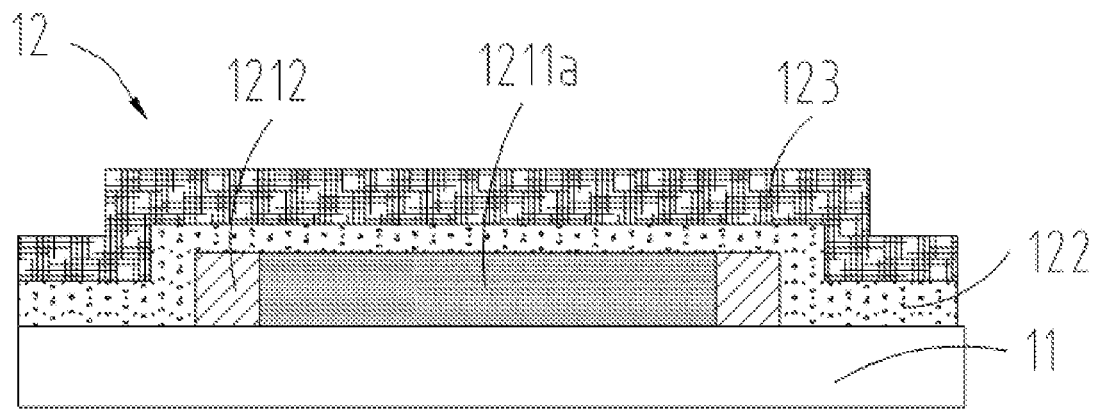
FIG. 3 is a schematic structural diagram of an array substrate according to an embodiment of the present invention.
Figure 4:
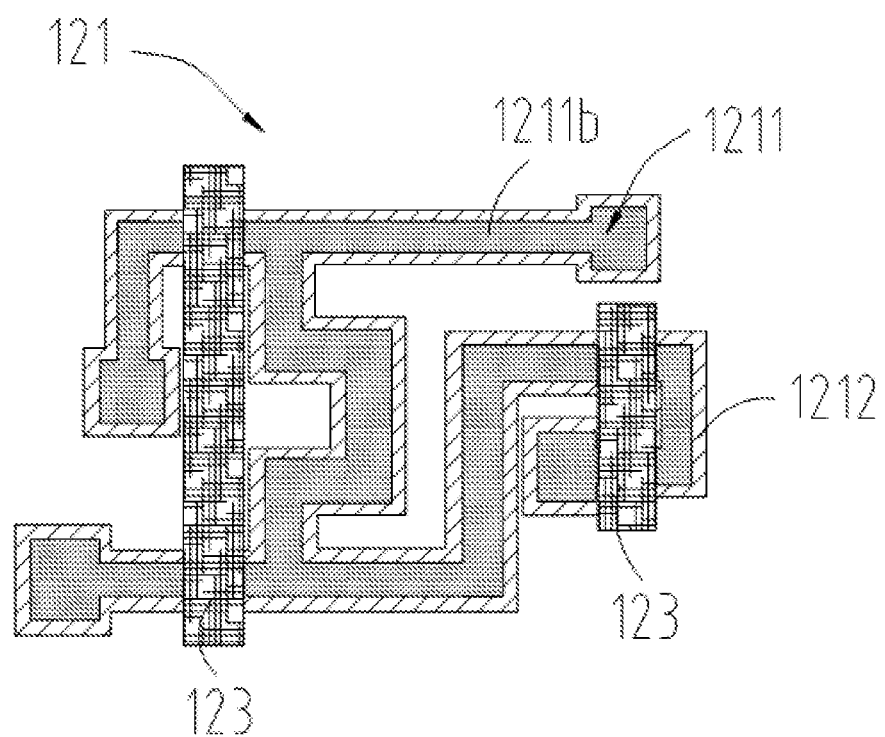
FIG. 4 is a partial structural diagram of an array substrate according to another embodiment of the present invention.
Figure 5:
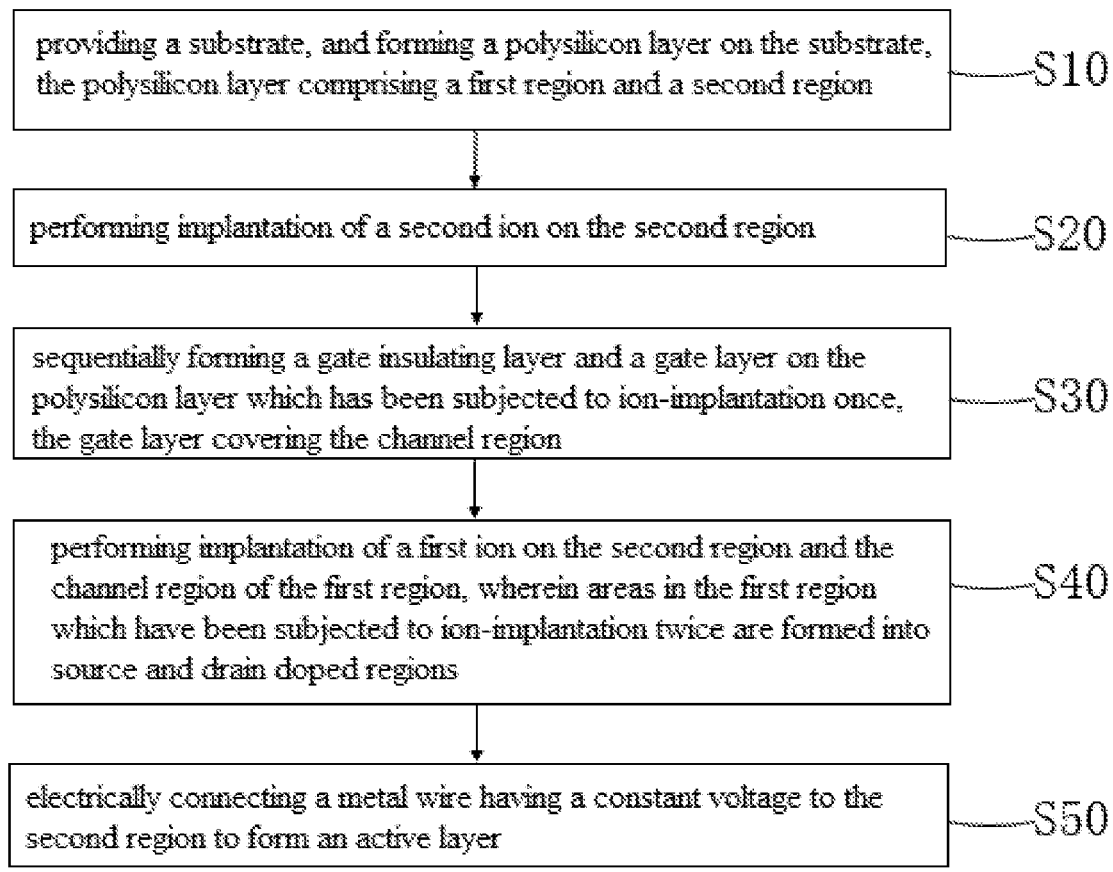
FIG. 5 is a schematic flow chart of a method of fabricating an array substrate according to another embodiment of the present invention.

Please refer to FIG. 3, which is a schematic structural diagram of an array substrate according to an embodiment of the present invention.

In an embodiment, the thin film transistor 12 further includes a gate insulating layer 122 disposed on the active layer 121 and a gate layer 123 disposed on the gate insulating layer 122.

A pattern of the gate layer 123 covers a pattern of a channel region 1212a from a top view. It can be understood that the pattern of the gate layer 123 covers the pattern of the channel region 1212a, but the region corresponding to a coverage region of the pattern of the gate layer 123 is not limited to the channel region 1212a.

In an embodiment, the second region 1212 surrounds the first region 1211, that is, the second region 1212 completely encloses the first region 1211.

Step S20, performing implantation of a second ion on the second region 1212.

In an embodiment, a photoresist layer is formed on the polysilicon layer, and then the photoresist layer is exposed and developed to obtain a pattern of the second region 1212. Next, the second region 1212 is subjected to the implantation of the second ion, and the patterned photoresist layer is stripped.

Figure 6A:
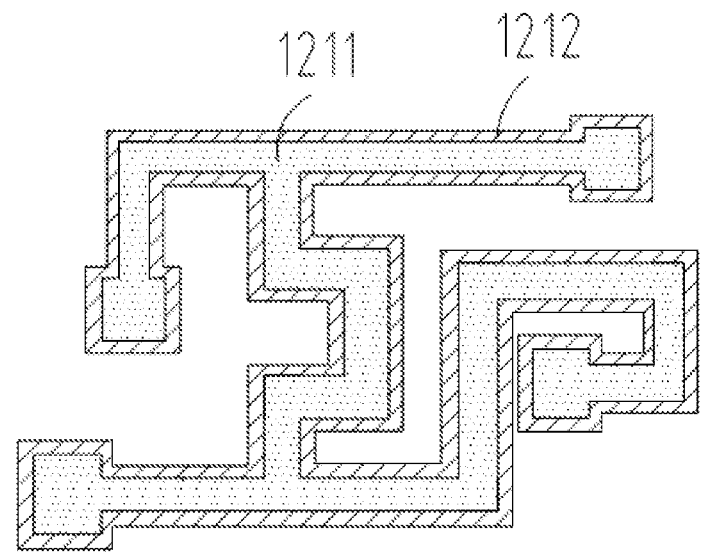
FIGS. 6a and 6b are schematic structural diagrams of a method of fabricating an array substrate according to another embodiment of the present invention.
Figure 6B:
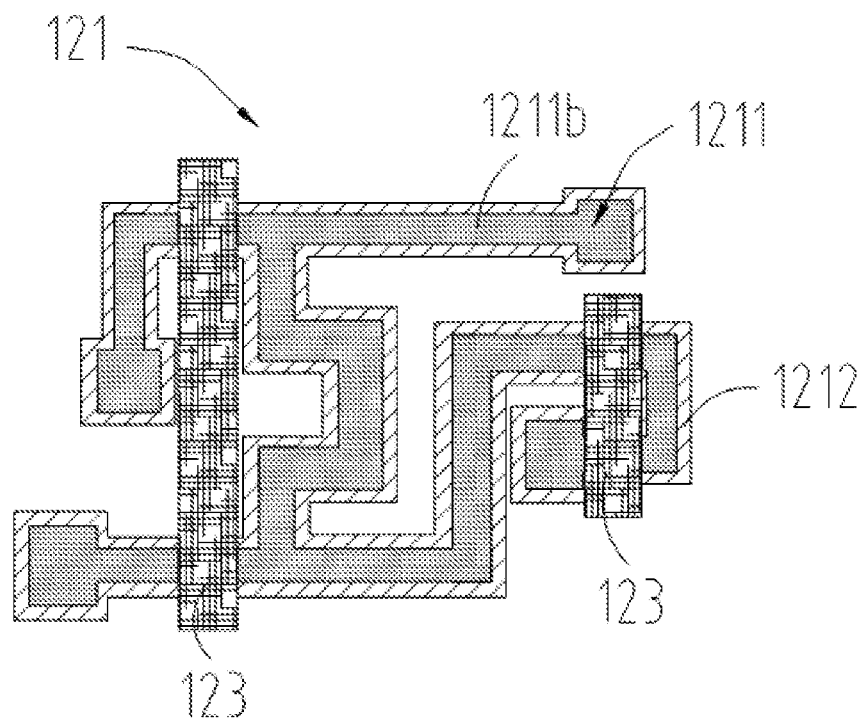

Refers to FIG. 6b, Step S30, sequentially forming a gate insulating layer 122 and a gate layer 123 on the polysilicon layer which has been subjected to ion-implantation once, the gate layer 123 covering the channel region 1211a.

Step S40, performing implantation of a first ion on the second region and the channel region of the first region. Due to the masking of the gate layer 123, the polysilicon layer under the gate layer 123 is not ion-implanted, thereby forming the channel region 1211a, while a region which is not masked by the gate layer 123 can be ion-implanted normally. Areas in the first region which have been subjected to ion-implantation twice are formed into source and drain doped regions 1211b In an embodiment, the first ion is different in conductivity from the second ion.

In an embodiment, a concentration of the second ion during the implantation of the second ion is greater than a concentration of the first ion during the implantation of the first ion, resulting in different conductivities of the second region 1212 and the source and drain doped regions 1211b, thus realizing electrically insulation of the second region 1212 from the first region 1211.

Step S50, electrically connecting a metal line having a constant voltage to the second region 1212 to form an active layer 121.

In an embodiment, the conductivity of the active layer 121 can be adjusted by the implant dose of the first ion and the second ion.

The first region 1211 includes the source and drain doped regions 1211b and a channel region 1211a between the source and drain doped regions 1211b, and the second region 1211b at least surrounds a side of the channel region 1211a not in contact with the source and drain doped regions 1211b, and the second region 1212 is electrically insulated from the first region 1211.

In an embodiment, the method of fabricating the array substrate further includes, but is not particularly limited to, sequentially forming an interlayer insulating layer, a source/drain metal layer, an organic layer, an anode layer, a pixel defining layer, a supporting layer, an organic light-emitting device, and an encapsulation layer on the gate layer.

The present invention provides an array substrate, a method of fabricating the same, and a display module. The present invention improves the bending resistance of a thin film transistor by providing a second region surrounding at least a side of a channel region not in contact with the source and drain doped regions to reduce bending stress received by the channel region.

While the invention has been described in detail and with reference to specific embodiments thereof, it is to be understood that the foregoing description is exemplary and explanatory in nature and is intended to illustrate the invention and its preferred embodiments. Through routine experimentation, one skilled in the art will readily recognize that various changes and modifications can be made therein without departing from the spirit and scope of the invention.

What is claimed is:

1. An array substrate, comprising a substrate and a thin film transistor disposed on the substrate, wherein an active layer of the thin film transistor comprises:
   a first region comprising source and drain doped regions doped with a first ion and two channel regions which are not ion-doped, each of the two channel regions disposed between the source and drain doped regions, a first source or drain doped region of the source and drain doped regions extending from a first side of one of the two channel region to a first side of the other of the two channel regions;
   a second region at least surrounding sides of the two channel regions that are not in contact with the source and drain doped regions, the second region being doped with a second ion;
   a gate insulating layer disposed on the active layer; and
   a gate layer disposed on the gate insulating layer, and wherein the gate layer overlaps a pattern of each of the two channel regions from a top view,
   wherein the second region contacts each of the two channel regions and extends along first of the source and drain doped regions so that the second region forms a PN junction with the first source or drain doped regions that extends from the side of the one of the two channel regions to the first side of the other of the two channel regions.

2. The array substrate according to claim 1, wherein the first region and the second region have different conductivities.

3. The array substrate according to claim 1, wherein the first ion and the second ion are derived from different elements.

4. The array substrate according to claim 1, wherein the first region and the second region have a same thickness.

5. The array substrate according to claim 1, wherein a pattern of the gate layer covers a pattern of the two channel regions from a top view.

6. The array substrate according to claim 1, wherein the second region surrounds the first region.

7. The array substrate according to claim 1, wherein the second region is connected to a metal line having a constant voltage.

8. A display module comprising an array substrate and a polarizer and a cover plate disposed over the array substrate, the array substrate comprising a substrate and a thin film transistor disposed on the substrate, wherein an active layer of the thin film transistor comprises:
   a first region comprising source and drain doped regions doped with a first ion and two channel regions which are not ion-doped, each of the two channel regions disposed between the source and drain doped regions, a first source or drain doped region of the source and drain doped regions extending from a first side of one of the two channel region to a first side of the other of the two channel regions; and
   a second region at least surrounding sides of the two channel regions that are not in contact with the source and drain doped regions, the second region being doped with a second ion;
   a gate insulating layer disposed on the active layer; and
   a gate layer disposed on the gate insulating layer, and wherein the gate layer covers a pattern of each of the two channel regions from a top view, wherein the second region contacts each of the two channel regions and extends along the first source or drain doped region so that the second region forms a PN junction with the first source or drain doped region that extends from the side of the one of the two channel regions to the first side of the other of the two channel regions.

9. The display module according to claim 8, wherein the first region and the second region have different conductivities.

10. The display module according to claim 8, wherein the first ion and the second ion are derived from different elements.

11. The display module according to claim 8, wherein the first region and the second region have a same thickness.

12. The display module according to claim 8, wherein a pattern of the gate covers a pattern of the two channel regions from a top view.

13. The display module according to claim 8, wherein the second region surrounds the first region.

14. The display module according to claim 8, wherein the second region is connected to a metal line having a constant voltage.

\* \* \* \* \*